United States Patent [19]

Maier

[11] Patent Number: 4,645,389

[45] Date of Patent: Feb. 24, 1987

[54] MULTIPLE-TOOTH DRILL BIT

[75] Inventor: Andreas Maier, Schwendi-Hörenhausen, Fed. Rep. of Germany

[73] Assignee: Hartmetallwerkzeugfabrik Andreas Maier GmbH & Co., Schwendi-Horenhausen, Fed. Rep. of Germany

[21] Appl. No.: 679,750

[22] Filed: Dec. 10, 1984

[30] Foreign Application Priority Data

Dec. 9, 1983 [DE] Fed. Rep. of Germany ....... 3344620

[51] Int. Cl.⁴ .............................................. B23B 51/02
[52] U.S. Cl. .................................... 408/230; 408/227; 408/214
[58] Field of Search ............... 408/199, 212, 213, 211, 408/225, 227, 229, 230, 214

[56] References Cited

U.S. PATENT DOCUMENTS

| 10,744 | 4/1854 | Pease | 408/211 |
|---|---|---|---|
| 2,334,089 | 11/1943 | Hallden | 408/211 |
| 2,391,396 | 12/1945 | Denison | 408/230 |
| 4,143,723 | 3/1979 | Schmotzer | 408/230 |
| 4,285,620 | 8/1981 | Luebbert et al. | 408/213 |
| 4,330,229 | 5/1982 | Croydon | 408/230 |
| 4,529,341 | 7/1985 | Greene | 408/230 |

FOREIGN PATENT DOCUMENTS

| 7710873 | 3/1977 | Fed. Rep. of Germany . |
| 8214987 | 9/1982 | Fed. Rep. of Germany . |
| 8307048 | 11/1983 | Fed. Rep. of Germany . |
| 873752 | 7/1942 | France . |
| 0066807 | 12/1982 | France . |

OTHER PUBLICATIONS

Technische Rundschau, Von K. Hauser 1976.
Article "Der Spiralbohrer Und Seine Wirtschaftliche Anwendung" (Gühring Vertriebsgesellschaft).

Primary Examiner—Gil Weidenfeld
Assistant Examiner—Daniel W. Howell
Attorney, Agent, or Firm—Karl F. Ross; Herbert Dubno

[57] ABSTRACT

A multiple-toothed drill bit having at least three teeth is provided with front end cutting edges having respective outer and inner cutting edge sections oriented angularly to each other and meeting at respective frontwardmost cutting points located in a common plane, and with an axial centering spur having laterally outwardly and rearwardly inclined center cutting edges merging with the inner front end cutting edge sections via respective frontwardly concave cutting edge sections.

18 Claims, 8 Drawing Figures

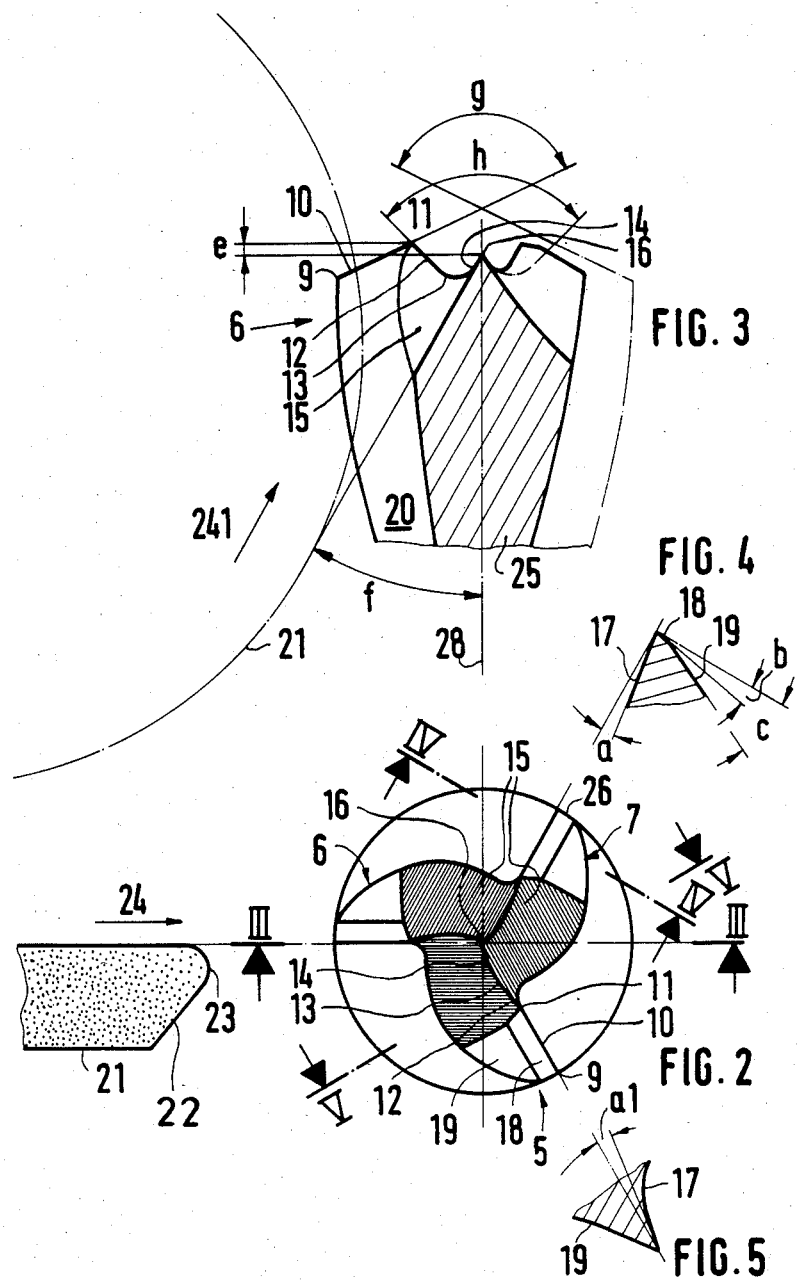

MULTIPLE-TOOTH DRILL BIT

CROSS-REFERENCE TO RELATED APPLICATION

The subject matter of the present application is related to that of my prior copending application Ser. No. 532,266, filed Sept. 14 1983, now U.S. Pat. No. 4,594,034, and to the extent necessary the entire disclosure of that prior application is hereby incorporated herein by this reference.

1. Field of the Invention

This invention relates to a multiple-tooth drill bit and, in particular, to a drill bit of this class having at least three teeth with generally radial front and cutting edges and with each cutting edge divided into an inner and an outer cutting edge section which meet at and diverge from a respective frontwardly directed cutting point.

2. Background of the Invention

Drill bits, especially two-toothed spiral-fluted drill bits having two front end cutting edges, are generally provided with a single centering spur located axially of the drill bit and having at its frontwardmost end a transverse or square-ended cutting edge. This type of cutting edge configuration is characterized by high frictional effects necessitating the application of higher feeding forces and facilitates the occurrence of radial deflections of the drill bit.

Also known are spiral-fluted three-toothed drill bits the flutes of which terminate in three generally rectilinear front end cutting edges meeting in a single generally conical tip. Since three-toothed drill bits necessarily have a larger core or shank diameter than two-toothed drill bits, the cutting edges of a three-toothed drill bit must be extended into the region of the core, i.e. the cutting edges are made pointy or, in other words, the spiral chip conveying flutes are provided with special tip end sections continuing into the conical tip portion of the drill bit. Drill bits of this type are characterized by satisfactory centering properties and running smoothness, but they tend to generate chips of cross-sectional sizes that lead, especially in the case of workpieces yielding lengthy chips, to problems in conveying the chips along the flutes.

In yet another known drill bit costruction, for example such as is shown in German GBM No. 83 07 048, each front end cutting edge is provided with a frontwardly projecting cutting point arranged eccentrically with respect to the axis of the drill bit and in a common plane perpendicular to the drill bit axis with the other two cutting points, and the respective inner and outer cutting edge sections which meet at and diverge from the respective cutting points lie on respective common running loci. Thus, when the drill bit is advanced against the workpiece, all three cutting edges in the regions of the respective cutting points begin cutting jointly with a common predetermined force arm while providing a joint 3-point support for the drill bit. In this manner the drilling efficiency can be substantially enhanced, and the stability of the drill bit against lateral deflections is also improved. Lateral deflections, however, are generally a function of different cutting forces exerted by the various cutting edges. In theory, of course, in a drill bit characterized by absolutely identical constructions and perfect symmetry of the cutting edges the respective cutting forces would be equal to one another, but in practice this is not realistically capable of being achieved. As a result, the differential radial forces acting on the drill bit must either be absorbed by special guide ribs or must be taken up by the lateral cutting edges of the drill bit.

It has already been proposed to incorporate in the principal front end cutting edges of such a three-toothed drill bit recessed edges extending parallel to the axis of the drill and arranged to cut a substantially cylindrical surface into the workpiece. Such a construction is shown, for example, in German GBM No. 77 10 873. Running smoothness of such a drill bit can, however, only be achieved to a very limited extent, and then only after the drill bit has already penetrated to a substantial extent into the workpiece. At the same time, when one is drilling holes into hard workpieces or workpieces with regular or irregular consistency or hardness distribution patterns, care should be taken that the rotation of the drill bit is not interrupted during the cutting operation, but this leads, over and above a certain degree of dimensional imprecision, to an out-of-round condition of the bore and an unduly large transverse stressing of the drill bit. This effect is most disadvantageous in the case of very thin drill bit, i.e. drill bits having diameters on the order of magnitude of 0.2 mm or less. Still further, and especially when a workpiece is made of different component materials which may even be irregularly distributed throughout the body of the workpiece, the risk of fracture of the tool rises markedly.

One of the utilitarian environments for drill bits of the class with which the present invention is concerned is the automatic drilling of holes into printed circuit boards for electrical and electronic instruments. Such printed circuit boards are generally provided in an automated fashion with a multiplicity of holes having diameters up to about 3.2 mm. During the drilling of these holes the stresses to which the drill bit is subjected are fairly high, primarily by virtue of the fact that such a circuit board is characterized by a matrix of a relatively soft material, typically a synthetic plastic material, which has embedded therein reinforcing fibers of a many times harder material, typically glass fibers or carbon fibers. Thus, in such a drilling operation the very thin drill bit repeatedly and alternatingly encounters the soft matrix material and then suddenly the hard fiber reinforcement. This entails, apart from the torsional loading of the drill bit, a tendency toward lateral deflection and thus a flexing or bending of the drill bit which, when occurring suddenly, can easily lead to failure of the drill bit. The risk of lateral deflection and flexural stressing of the drill bit are of course the greater, the less the precision of centering and the less the trueness of running of the drill bit.

In the manufacture of printed circuit boards, therefore, the following requirements should be met in the formation of holes with diameters of up to 3.175 mm:

1. The maximum attainable precision of drill bit location, both upon entry into and penetration through the workpiece, and no lateral deviation or run-out of the drill bit.
2. The provision of holes which are bur-free both where the drill bit enters and where it emerges from the workpiece.
3. Clean holes without coalescence or melting of component materials.
4. Perfect roundness of the holes.

This leads to the following requirements for the drill bit to be used in the formation of holes in a printed circuit board:

(a) Very good centering properties.
(b) Sharp cutting edges and a precisely designed cutting edge geometry.
(c) Minimal friction between the drill bit and the wall of the hole.
(d) Good conveying of drilling chips.
(e) A high degree of trueness of rotation.
(f) A high degree of quietness of running.
(g) Minimal edge wear and maximized useful tool life.

BRIEF DESCRIPTION OF THE INVENTION

It is the object of the present invention, therefore, to provide a novel and improved construction of a multiple-tooth drill bit of the aforesaid class which is characterized by maximized cutting efficiency, precise centering both when entering and when moving through the workpiece, and by minimized bending or flexural stresses and high useful tool life even when the workpieces are very hard or when the workpieces are composed of materials of different hardnesses or have different interior consistencies or hardness distributions.

Generally speaking, the objectives of the present invention are achieved by means of an improvement in a multiple-toothed drill bit which has at least three teeth with front end cutting edges extending generally radially of the core of the drill bit, and in which the front end cutting edge of each tooth has radially outer and inner cutting edge sections that meet at and diverge from a respective cutting point directed frontwardly of the drill bit and located with the other cutting points in a common plane perpendicular to the drill bit axis, with the outer section of each front end cutting edge of each tooth being inclined, as viewed from its laterally outwardmost tip toward its associated cutting point, in the direction toward the common plane and frontwardly of the drill bit, and with the inner section of each front end cutting edge of each tooth being inclined, as viewed from its associated cutting point toward the drill bit core, in the direction away from the common plane and rearwardly of the drill bit. In particular, the improvement comprises that (a) an auxiliary centering element in the form of a centering spur is provided axially at the front end of the drill bit, which centering spur has a plurality of laterally outwardly and rearwardly inclined center cutting edges spaced from each other circumferentially of the centering spur, and that (b) the inner section of the front end cutting edge of at least one of the teeth leads directly to and merges with an associated one of the center cutting edges of the centering spur.

One of the advantages of this construction is that chips shaved from the workpiece are cut into smaller pieces at the front end cutting edges by means of the forwardly projecting cutting points of the angularly arranged cutting edge sections. Thus, the outer cutting edge section in each case can be oriented at a positive angle, which facilitates a clean and bur-free cutting operation in that the inclination of the cutting edges at their outermost tips enables the chips to be readily separated from the workpiece in the radial direction and transferred inwardly into the respective flutes. The cross-sections of the flutes can thus be adapted to the quantities of chips generated, which are primarily conveyed away along the outer regions of the drill bit, so that this can be effected with minimal friction and free of coalescence and melting.

The outermost portion of the inner front end cutting edge section of each tooth of the drill bit can also be oriented at a positive angle, but closer to the centering spur, and especially at the center cutting edges, only a negative angle can be utilized. This has the tendency to increase the cutting resistance as well as the resistance to the feeding or advancing of the drill bit. By virtue of the required higher cutting pressure, therefore, the centering spur provides a stabilizing effect which leads to a quiet running of the tool free of natural oscillations and thereby leads to the formation of precisely round and bur-free holes. In this manner there is achieved, apart from an improvement in the precision of positioning of the drill bit, a reduction in the stressing of the drill bit. Moreover, after a predetermined limited penetration of the drill bit into the workpiece has been achieved, the transverse forces exerted by the workpiece on the drill bit are efficaciously counteracted, and as a result both tool wear and the risk of tool fracture are minimized.

In this regard, it is to be noted that in the present invention the centering spur of the drill bit may have its front end tip region located either rearwardly or frontwardly of the common plane in which the cutting points of the front end cutting edges are located. The initial centering action thus is effected either by means of the cutting points at the junctions between the respective inner and outer cutting edge sections or by the centering spur of the drill bit. Moreover, even when the bit encounters a harder component of a variable-consistency workpiece, such as a reinforcing glass fiber or carbon fiber, a radial deflection of the drill bit is substantially inhibited without any great frictional forces being generated at the walls of the hole. This enables the use of guide ribs to be dispensed with, and even the lateral cutting edges and straight lands are substantially relieved of stresses. As a consequence thereof the drill bit can be provided with an outer diameter which diminished rearwardly, i.e. in the direction away from the front end cutting edges, which in turn further reduces the frictional rubbing between the sides of the drill bit and the workpiece.

BRIEF DESCRIPTION OF THE DRAWING

The foregoing and other objects, characteristics and advantages of the present invention will be more clearly understood from the following detailed description thereof when read in conjunction with the accompanying drawing, in which:

FIG. 2 is a front end view of the drill bit shown in FIG. 1;

FIGS. 3, 4 and 5 are, respectively, fragmentary sectional views taken along the lines III—III, IV—IV and V—V in FIG. 2;

DETAILED DESCRIPTION OF THE INVENTION

Figure 1:
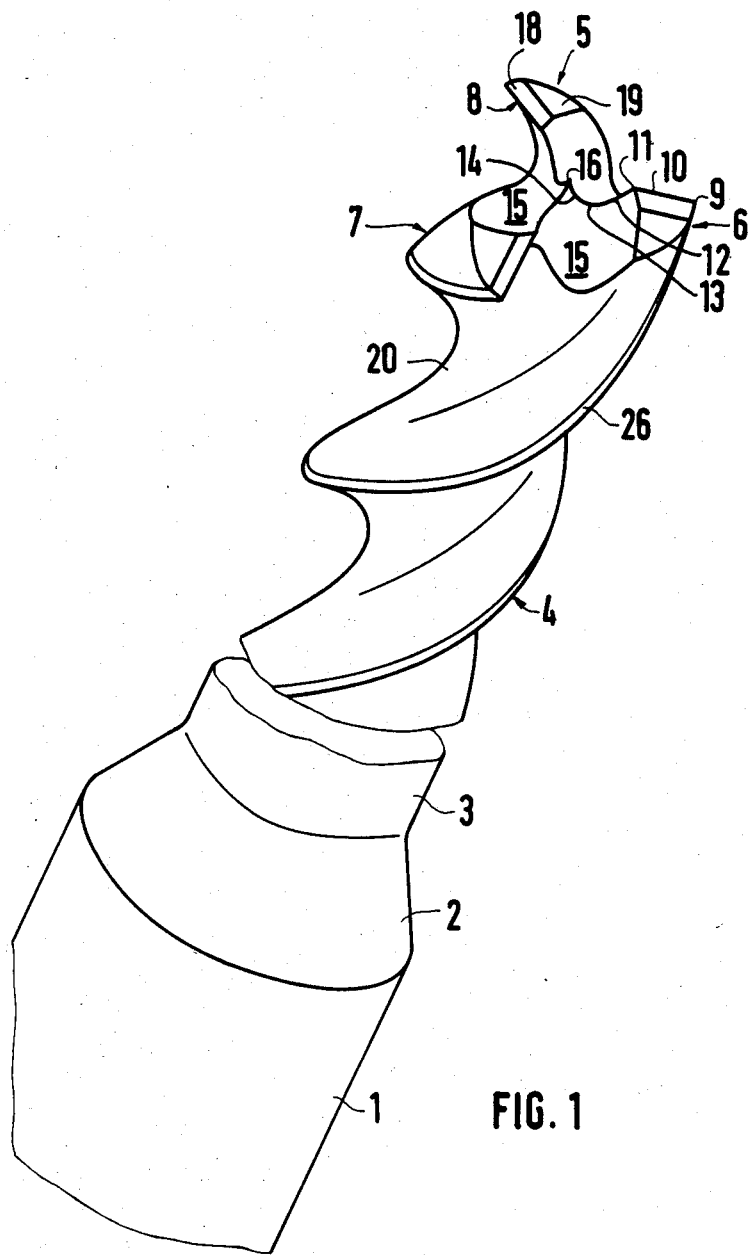
FIG. 1 is a fragmentary perspective illustration of a three-toothed drill bit according to one embodiment of the present invention.

Referring now to the drawing in greater detail, FIG. 1 shows, on a greatly enlarged scale, a three-toothed spiral-fluted drill bit which has a relatively large diameter base portion 1 by which the drill bit can be gripped in a drill chuck. The base or gripping portion 1 is connected via a conical transition portion 2 to the rearwardmost end of a cylindrical shank 3 of the drill bit which in its forward end region becomes the spiral-fluted portion 4 of the drill bit. As is conventional in this art, the entire drill bit can be made as a single piece of a suitable cutting tool material such as tool steel or carbide metal, or alternatively the actual cutting portions of the drill bit can be made of such materials and then brazed onto a tool shank made of a suitable high strength structural steel or the like. Inasmuch as the drill bit of the present invention is principally intended for drilling holes into printed circuit boards, it is contemplated that as a general rule the cutting material will be carbide metal or possibly polycrystalline diamond or a like ultrahard cutting material such as cubic crystalline boron nitride.

The illustrated drill bit includes three circumferentially equally spaced cutting teeth 5, 6 and 7 having respective front end cutting edges 8 extending generally radially of the drill bit core 25 and each having an outermost tip 9 and being divided into an outer cutting edge section 10 and an inner cutting edge section 12 which are angularly oriented relative to one another and meet at and diverge from a respective frontwardly directed cutting point 11. All the cutting points 11 are located in a common plane perpendicular to the axis 28 of the drill bit. Intermediate the helical side lands or lateral cutting edges 26 of the teeth 5, 6 and 7, the drill bit is provided with respective spiral chip-conveying flutes 20 each of which merges at its frontwardmost end into a tip flute section 15. At its front end the drill bit is provided with an axial, generally triangularly pyramid-shaped centering spur 16 which has three laterally outwardly and rearwardly inclined center cutting edges 14, these being circumferentially equally spaced about the cutting spur and meeting at the frontwardmost tip of the centering spur and each merging with a respective frontwardly concave transition cutting edge section 13 which in turn merges with an associated one of the inner front end cutting edge sections 12. As best shown in FIGS. 2 and 3, each of the tip flute sections 15 defines the back side of a respective tooth in the region of the inner front end cutting edge section 12, the associated transition cutting edge section 13, and the associated center cutting edge 14 and terminates jointly with the other tip flute sections at the centering spur 16.

Referring now to FIG. 4, the tooth face 17 of the outer cutting edge section 10 is oriented at a positive angle a, while the land 18 forms a first clearance angle b and the tooth flank 19 forms a second clearance angle c. As further shown in FIGS. 2 and 3, the tip flut sections 15, which are identical, are formed with the aid of a grinding disk 21 the diameter of which is approximately 20 times greater than the maximum diameter of the drill bit as measured at the front end cutting edge tips 9. The grinding disk 21 is fed toward the drill bit core 25 with its flat front edge 22 and arcuate edge section 23 leading, the direction of feed being parallel to the tooth face 17 of the outer cutting edge section 10 and as indicated by the arrows 24 and 241, so as to cause the grinding disk to engage the drill bit through each flute 20 at an angle f to the axis 28 of the drill bit. The arrangement can be such that the center cutting edges 14 meet directly on the axis 28 of the drill bit, i.e. at the frontwardmost tip of the centering spur 16, but they can also terminate somewhat short of that tip if, for example, the centering spur is triangularly truncated. The magnitude of the rake angle diminishes from the value a in the region of the outer front end cutting edge section 10 to zero in the region of the inner front end cutting edge section 12 and then becomes negative, reaching approximately the value a1 (FIG. 5) in the region of the transition cutting edge section 13. This negative angle is then enlarged, corresponding to the arcuate face portion 23 of the grinding disk 21, up to the centering spur 16, so that the cutting action thereby is transformed into a scraping action.

By virtue of the positive rake angle at the outer front end cutting edge sections 10, the drilling or cutting resistance at those sections and over the greater portion of the drill bit diameter is relatively minimized, while at the same time the conveying away of chips is facilitated in the relatively large volume flutes 20. This is accompanied, by virtue of the described inclination of the outer cutting edge sections 10, by a separation of the chips from the outer periphery of the drill bit inwardly, with the chips being easily conducted away from the outer periphery of the drill bit and toward its inner regions. Under these conditions the drilling resistance increases from the outside in, in line with the described corresponding change of the rake angle, so that at the centering spur 16 there is achieved a central feed and rotation resistance which is smaller than has heretofore been encountered with a square-ended centering spur of a two-toothed drill but but enables a comparable centering action to be achieved.

In the embodiment of the invention shown in FIGS. 1-5, the axial centering spur 16 is located rearwardly, by a distance e, of the common plane in which the respective cutting points 11 are located. This arrangement is especially suited for drilling holes into hard workpieces or workpieces with hardness values changing from one point to another as is the case in fiber-reinforced printed circuit boards.

By virtue of the construction of the three-toothed drill bit according to the embodiment of the present invention so far described, when a hole is to be drilled into a workpiece the drill bit first comes into engagement with the workpiece at the three cutting points 11, which ensures a proper centering of the drill bit because the cutting points provide a 3-point support for the drill bit. It will be understood, however, that an acceptable degree of centering of the drill bit will be achievable by such a construction even if all the cutting points 11 are not located exactly the same distance frontwardly of the tip of the centering spur 16, that is to say even if all of the main cutting edges 8 are not formed fully identically with each other and are not identically symmetrically arranged with respect to the axis of the drill bit. Because the cutting forces exerted by the cutting points 11 are relatively minimal, the likelihood of a detrimental lateral deflection of the drill bit is effectively avoided. As soon as the centering spur 16 then penetrates into the workpiece, of course, an increase in the resistance to cutting occurs, which in turn leads to the drill bit running quietly and steadily and being secured to an even better degree against deflection forces. The lateral cutting edges 26 of the teeth, i.e. the side lands, thus can take over the guiding of the drill bit in the workpiece while being subjected to relatively minimal contact forces, so that the drilling operation can be effected with a minimum of wear. This enables holes to be formed which are completely bur-free at both the place where the drill bit enters the workpiece and at the place where the drill bit emerges from the workpiece.

One of the characteristics of the drill bit according to this embodiment of the present invention is that all of the outer front end cutting edge sections 10 lie on the same running locus centered at the axis 28 of the drill bit, with those cutting edge sections (see FIG. 3) forming a tip angle g of about 120°-130°. Correspondingly, the angle h formed by the inner front end cutting edge sections 12, all of which likewise lie on a common locus, is about 80°. It will be understood that the smaller the angle h, the greater is the centering action effected by means of the cutting points 11 and the inner front end cutting edge sections 12, which is significant primarily for the preliminary centering action. The tip angle defined by the centering spur 16 has a magnitude of 2f and is equal to approximately 60°. This value of the angle has been found to be advantageous because an adequate centering action can be effected with a relatively minimal penetration resistance.

The outer diameter of the spiral section 4 of the drill bit, as previously indicated, generally diminishes rearwardly from its maximum value at the locus of the outermost tips 9 of the front end three cutting edges 8, so that whereas the drill bit is fairly tightly guided at its front end by the contact between the lateral cutting edges or side lands 26 with the wall of the bore or hole being drilled into the workpiece, those cutting edges are gradually less and less stressed as one proceeds rearwardly of the drill bit. The centering spur, of course, ensures that adequate radial support is provided for the drill bit in the region of the main cutting edges.

Figure 7:
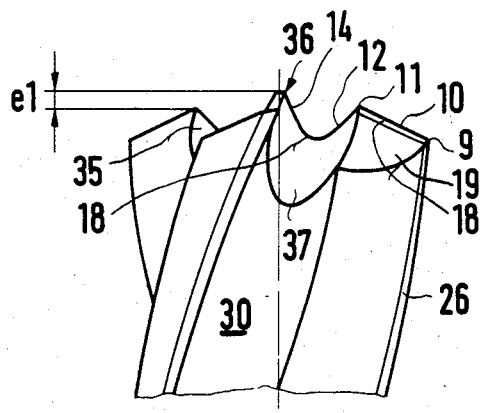
FIG. 7 is a fragmentary perspective illustration of the drill bit shown in FIG. 6.
Figure 6:
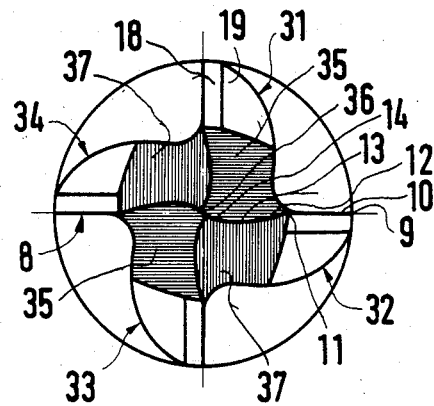
FIG. 6 is an end view, similar to FIG. 2, of a four-toothed drill bit according to another embodiment of the present invention.
Figure 8:
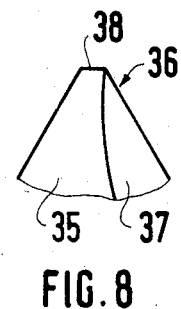
FIG. 8 is a fragmentary perspective illustration of the centering spur of the drill bit of FIGS. 6 and 7.

Referring now to FIGS. 6 to 8, the front end cutting edges 8 of the four teeth 31, 32, 33 and 34 there shown have almost exactly the same form or shape as the cutting edges of the three-toothed drill bit described hereinbefore. It is for this reason that the cutting edges of the drill bit shown in FIGS. 6 to 8 are designated by substantially the same reference numerals as are used for the cutting edges in FIGS. 1 to 5. Only the spiral chip-conveying flutes 30, the associated tip flute sections 35 and 37, and the centering spur 36 differ in shape from the corresponding elements of the three-toothed drill bit, but the differences are in essence only those which are mandated by the difference between three and four teeth. It can also be seen from FIG. 6 that the two diametrally opposed chip-conveying flutes 37 are somewhat narrower than the other two chip-conveying flutes 35.

As best shown in FIG. 8, the centering spur 36 has a square-ended pyramid like shape defining at its frontwardmost tip a cross-cutting edge 38 the function of which is the same as in the heretofore known two-toothed drill bits and thus has a centering action comparable fully to that of the star shaped series of center cutting edges 14 of the centering spur 16 in the three-toothed drill bit. In addition, the centering spur 36 in the embodiment of the invention illustrated in FIGS. 6 to 8 is located forwardly of the common plane of the cutting points 11 by a distance e1, so that even the preliminary centering action is taken over by the centering spur. Since, in this case, the centering spur is more greatly stressed than when, as in the three-toothed drill bit, it is located rearwardly of the common plane of the cutting points 11, it is found advisable to utilize the drill bit construction shown in FIGS. 6 to 8 primarily for drilling holes into relatively soft workpieces having a regular consistency or hardness distribution.

It will be understood that the arcuate frontwardly concave transition cutting edge sections 13 are a significant aspect of the drill bits according to the present invention because they enable a conveying away of the chips or waste material scraped off in the region of the drill bit axis 28 without this having any adverse effect on the centering action.

The axial distance e or e1 between the frontwardmost tip of the centering spur and the common plane of the cutting points 11 will ordinarily lie, depending on the characteristics of the workpiece, between 2 and 20% of the maximum diameter of the drill bit, with an axial distance of about 5 to 12% of that diameter being preferred, and with the larger values being intended to be utilized for the penetration of the drill bit into softer workpieces. The tip angle of the centering spur will also be made smaller the more the centering spur is located forwardly of the level of the transition cutting edge sections 13. This angle, as can be visualized from FIG. 8, will be less than 60° in the case of a four-toothed drill bit but should not in any event be less than about 40°.

As is clearly to be seen from the four-toothed drill bit, it is not essential even in the case of a three-toothed drill bit that all of the main front end cutting edges 8 extend to and meet at the axis of the drill bit. In principle it would be sufficient if only one of the center cutting edges 14 were to terminate at the tip of the centering spur, but such an arrangement could give rise to radial deflection forces which would then have to be compensated for. Since this might be somewhat difficult and possibly not always feasible, the construction where the center cutting edges all meet at the tip of the centering spur is preferred.

Although, in the present state of the art, among drill bits having odd numbers of teeth a three-toothed drill bit is of greater significance, the principles of that construction could be embodied in a drill bit having an odd number of teeth greater than three. Likewise, the principles of the four-toothed drill bit could be embodied in any drill bit having an even number of teeth greater than four. Moreover, although as a rule the drill bits according to the present invention will be characterized by spiral flutes, it should be apparent that for special purposes a drill bit could be provided with side lands extending generally or almost parallel to the axis of a drill bit.

It will be understood that the foregoing description of preferred embodiments of the present invention is for purposes of illustration only, and that the various structural and operational features and relationships herein disclosed are susceptible to a number of changes and modifications none of which entails any departure from the spirit and scope of the present invention as defined in the hereto appended claims.

I claim:

1. In a multiple-tooth drill bit for drilling holes into a workpiece, wherein the drill bit has a tip formed with at least three teeth the front end cutting edges of which extend generally radially of the core of the drill bit, a plane perpendicular to an axis of the drill bit extending through said tip, said cutting edge of each tooth having radially outer and inner cutting edge sections which meet at and diverge from a respective cutting point that is directed frontwardly of the drill bit, said outer section of each front end cutting edge of each tooth being inclined, as viewed from its laterally outwardmost tip toward its associated cutting point, in a direction toward said plane and frontwardly of the drill bit, and with said inner section of each front end cutting edge of each tooth being inclined, as viewed from its associated cutting point toward said drill bit core, in a direction away from said plane and rearwardly of the drill bit, the improvement comprising that:
(a) an auxiliary centering element in the form of a centering spur is provided at the front end of said drill bit core and axially thereof, said centering spur having a frontwardmost tip and a plurality of laterally outwardly and rearwardly inclined center cutting edges spaced from each other circumferentially of said centering spur and meeting at said frontwardmost tip, and
(b) said inner section of said front end cutting edge of at least one of said teeth leads directly to and merges with an associated one of said center cutting edges of said centering spur.

2. In a multiple tooth drill bit for drilling holes into a workpiece, wherein the drill bit has a tip formed with at least three teeth the front end cutting edges of which extend generally radially of the core of the drill bit, a plane perpendicular to an axis of the drill bit extending through said tip, said cutting edge of each tooth having radially outer and inner cutting edge sections which meet at and diverge from a respective cutting point that is directed frontwardly of the drill bit and is located in said plane, said outer section of each front end cutting edge of each tooth being inclined, as viewed from its laterally outwardmost tip toward its associated cutting point, in the direction toward said plane and frontwardly of the drill bit, and with said inner section of each front end cutting edge of each tooth being inclined, as viewed from its associated cutting point toward said drill bit core, in the direction away from said plane and rearwardly of the drill bit, the improvement comprising that:
(a) an auxiliary centering element in the form of a centering spur is provided at the front end of said drill bit core and axially thereof, said centering spur having a frontwardmost tip and a plurality of laterally outwardly and rearwardly inclined center cutting edges spaced from each other circumferentially of said centering spur and meeting at said frontwardmost tip,
(b) said inner section of said front end cutting edge of at least one of said teeth leads directly to and merges with an associated one of said center cutting edges of said centering spur,
(c) said inner section of said front end cutting edge of said tooth and its associated center cutting edge of said centering spur merges with each other through a frontwardly concave transition cutting edge.

3. In a drill bit as claimed in claim 2, wherein said drill bit has an even number of teeth, the improvement comprising that said inner sections of said front end cutting edges of at least two diametrically opposed teeth lead directly to and merge each with an associated one of said center cutting edges of said centering spur.

4. In a drill bit as claimed in claim 2, the improvement comprising that all of said outer sections of said front end cutting edges of said teeth, from their respective outwardmost tips to their respective cutting points, are located on a common locus.

5. In a drill bit as claimed in claim 2, the improvement comprising that all of the combinations of an inner front end cutting edge section and the associated center cutting edge and transition cutting edge section, inwardly of the respective cutting points, are located on a common locus.

6. In a drill bit as claimed in claim 2, the improvement comprising that:
(a) said teeth are helical and define (i) spiral waste chip-conducting flutes between said teeth and (ii) spiral side lands extending along the drill bit at the longitudinal edges of said teeth, and
(b) the trailing surfaces of said teeth at those frontwardmost inner end regions of said flutes which are closer to the drill bit axis and in line with said inner sections of said front end cutting edges of said teeth are ground away and define respective flute end sections directed toward said centering spur and said inner sections of said front end cutting edges of said teeth.

7. In a drill bit as claimed in claim 6, the improvement comprising that:
(a) said inner section of said front end cutting edge of at least said one tooth and its associated center cutting edge of said centering spur merge with each other through a frontwardly concave transverse cutting edge section, and
(b) at least the flute end section in line with said concave transition cutting edge section is correspondingly frontwardly concave.

8. In a drill bit as claimed in claim 6, the improvement comprising that said flute end sections are disposed symmetrically with respect to the axis of the drill bit.

9. In a drill bit as claimed in claim 2, the improvement comprising that said frontwardmost tip of said centering spur is located frontwardly of said plane of said cutting points, whereby said drill bit is adapted for drilling holes in soft workpieces of homogeneous consistency.

10. In a drill bit as claimed in claim 9, the improvement comprising that the distance by which said frontwardmost tip of said centering spur is located frontwardly of said plane of said cutting points is between 2 and 20% of the maximum diameter of said drill bit.

11. In a drill bit as claimed in claim 9, the improvement comprising that the distance by which said frontwardmost tip of said centering spur is located frontwardly of said plane of said cutting points is between 5 and 12% of the maximum diameter of said drill bit.

12. In a drill bit as claimed in claim 2, the improvement comprising that said frontwardmost tip of said centering spur is located rearwardly of said plane of said cutting points, whereby said drill bit is adapted for drilling holes in hard workpieces and in workpieces of non-homogeneous consistency.

13. In a drill bit as claimed in claim 12, the improvement comprising that the distance by which said frontwardmost tip of said centering spur is located rearwardly of said plane of said cutting point is between 2 and 20% of the maximum diameter of said drill bit.

14. In a drill bit as claimed in claim 12, the improvement comprising that the distance by which said frontwardmost tip of said centering spur is located rearwardly of said plane of said cutting points is between 5 and 12% of the maximum diameter of said drill bit.

15. In a drill bit as claimed in claim 2, the improvement comprising that:
(a) said inner section of said front end cutting edge of each of said teeth and its associated center cutting edge of said centering spur merge with each other through a frontwardly concave transition cutting edge section, and
(b) the angular width of said centering spur, defined as twice the angle included at said frontwardmost tip of said centering spur between the axis of said drill bit and one of said center cutting edges is made smaller the more said centering spur projects beyond the rearwardmost level of said concave transition cutting edge sections.

16. In a drill bit as claimed in claim 15, the improvement comprising that said angular width of said centering spur is in the range of 40° to 120°.

17. In a drill bit as claimed in claim 15, the improvement comprising that said angular width of said centering spur is in the range of 50° to 80°.

18. In a multiple tooth drill bit for drilling holes into a workpiece, wherein the drill bit has a tip formed with at least three teeth the front end cutting edges of which extend generally radially of the core of the drill bit, a plane perpendicular to an axis of the drill bit extending through said tip, said cutting edge of each tooth having radially outer and inner cutting edge sections which meet at and diverge from a respective cutting point that is directed frontwardly of the drill bit, said outer section of each front end cutting edge of each tooth being inclined, as viewed from its laterally outwardmost tip toward its associated cutting point, in the direction toward said plane and frontwardly of the drill bit, and with said inner section of each front end cutting edge of each tooth being inclined, as viewed from its associated cutting point toward said drill bit core, in the direction away from said plane and rearwardly of the drill bit, the improvement comprising that:

(a) an auxiliary centering element in the form of a centering spur is provided at the front end of said drill bit core and axially thereof, said centering spur having a frontwardmost tip and a plurality of laterally outwardly and rearwardly inclined center cutting edges spaced from each other circumferentially of said centering spur and meeting at said frontwardmost tip, (b) said inner section of said front end cutting edge of at least one of said teeth leads directly to and merges with an associated one of said center cutting edges of said centering spur, (c) said frontwardmost tip of said centering spur is square ended to define a cross-cutting edge.

* * * * *